United States Patent
Hsu et al.

(10) Patent No.: US 12,184,246 B2
(45) Date of Patent: Dec. 31, 2024

(54) DRIVING CIRCUIT OF LOUDSPEAKER AND METHOD FOR GENERATING CURRENT SAMPLING SIGNAL OF LOUDSPEAKER

(71) Applicant: Elite Semiconductor Microelectronics Technology Inc., Hsinchu (TW)

(72) Inventors: Che-Wei Hsu, Hsinchu (TW); Wun-Long Yu, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 474 days.

(21) Appl. No.: 17/568,732

(22) Filed: Jan. 5, 2022

(65) Prior Publication Data

US 2023/0216458 A1    Jul. 6, 2023

(51) Int. Cl.
*H03F 3/21*    (2006.01)
*H03F 3/187*    (2006.01)
*H03F 3/217*    (2006.01)
*H03F 3/45*    (2006.01)

(52) U.S. Cl.
CPC ............. *H03F 3/217* (2013.01); *H03F 3/187* (2013.01); *H03F 3/45475* (2013.01); *H03F 2200/03* (2013.01)

(58) Field of Classification Search
CPC ...... H03F 3/217; H03F 3/187; H03F 3/45475; H03F 2200/03; H03F 3/2171; H04R 3/007

USPC .......................................................... 330/10
See application file for complete search history.

(56) References Cited

U.S. PATENT DOCUMENTS

2017/0141743 A1*  5/2017  Berkhout ............. H04R 29/001

FOREIGN PATENT DOCUMENTS

CN          111044780 A       4/2020

* cited by examiner

*Primary Examiner* — Andrea Lindgren Baltzell
*Assistant Examiner* — Jose E Pinero
(74) *Attorney, Agent, or Firm* — Winston Hsu

(57) ABSTRACT

A driving circuit of a loudspeaker includes a periodic signal generation circuit, a signal processing circuit, a class-D amplifier circuit, a current sensing circuit, and a sample and hold circuit. The periodic signal generation circuit is arranged to generate a periodic signal and a control signal. The signal processing circuit is coupled to the periodic signal generation circuit, and is arranged to generate a pre-driving signal. The class-D amplifier circuit is coupled to the signal processing circuit, and is arranged to drive the loudspeaker according to the pre-driving signal. The current sensing circuit is coupled to the class-D amplifier circuit, and is arranged to generate a current sensing signal. The sample and hold circuit is coupled to the periodic signal generation circuit and the current sensing circuit, and is arranged to sample and hold the current sensing signal according to the control signal, to generate a current sampling signal.

20 Claims, 7 Drawing Sheets

DRIVING CIRCUIT OF LOUDSPEAKER AND METHOD FOR GENERATING CURRENT SAMPLING SIGNAL OF LOUDSPEAKER

BACKGROUND OF THE INVENTION

1. Field of the Invention

The present invention is related to current sampling, and more particularly, to a driving circuit of a loudspeaker and associated method for generating a current sampling signal of the loudspeaker.

2. Description of the Prior Art

A loudspeaker is a device having a voice coil that moves a diaphragm and converts an electrical signal into an acoustic signal. When the temperature of the voice coil is too high or the displacement of the diaphragm is too large, the loudspeaker may be damaged. For a typical class-D amplifier, it is arranged to drive the loudspeaker to achieve the effect of playing music. However, in order to prevent the loudspeaker from being damaged, a smart amplifier may further need to detect the condition of the loudspeaker (e.g. obtain a current signal flowing through the loudspeaker), to determine a working condition (e.g. temperature) under which the loudspeaker is operated.

For example, a plurality of current sensing resistors (e.g. two current sensing resistors) may be added to a class-D amplifier that is coupled to the loudspeaker to measure the current flowing through the loudspeaker. One current detection architecture may couple the current sensing resistors to both sides of the loudspeaker. Another current detection architecture may couple the current sensing resistors to the ground. Compared with the former, the current detection architecture that couples the current sensing resistors to the ground has a better noise floor. However, if the current sensing resistors are not matching (e.g. resistance values of the current sensing resistors are different), this architecture may have a poor second-order harmonic distortion. In addition, the mismatch of the current sensing resistors may cause the problem of DC offset. As a result, a novel driving circuit of the loudspeaker with this architecture and associated method for generating a current sampling signal of the loudspeaker are urgently needed.

SUMMARY OF THE INVENTION

It is therefore one of the objectives of the present invention to provide a driving circuit of a loudspeaker and associated method for generating a current sampling signal of the loudspeaker, to address the above-mentioned issues.

According to one embodiment of the present invention, a driving circuit of a loudspeaker is provided. The driving circuit may include a periodic signal generation circuit, a signal processing circuit, a class-D amplifier circuit, a current sensing circuit, and a sample and hold circuit. The periodic signal generation circuit may be arranged to generate a periodic signal and a control signal, wherein the control signal is arranged to indicate occurrence timing of a specific extreme value of the periodic signal. The signal processing circuit may be coupled to the periodic signal generation circuit, and may be arranged to receive a first audio input signal, a second audio input signal, and the periodic signal, and generate a pre-driving signal according to the first audio input signal, the second audio input signal, and the periodic signal, wherein the second audio input signal is an inverse of the first audio input signal. The class-D amplifier circuit may be coupled to the signal processing circuit, and may be arranged to drive the loudspeaker according to the pre-driving signal. The current sensing circuit may be coupled to the class-D amplifier circuit, and may be arranged to sense a driving current of the loudspeaker to generate a current sensing signal. The sample and hold circuit may be coupled to the periodic signal generation circuit and the current sensing circuit, and may be arranged to sample and hold the current sensing signal according to the control signal, to generate a current sampling signal of the loudspeaker.

According to one embodiment of the present invention, a method for generating a current sampling signal of a loudspeaker is provided. The method may include: generating a periodic signal and a control signal, wherein the control signal is arranged to indicate occurrence timing of a specific extreme value of the periodic signal; generating a pre-driving signal according to a first audio input signal, a second audio input signal, and the periodic signal, wherein the second audio input signal is an inverse of the first audio input signal; driving the loudspeaker, by a class-D amplifier circuit, according to the pre-driving signal; sensing a driving current of the loudspeaker to generate a current sensing signal; and sampling and holding the current sensing signal according to the control signal, to generate the current sampling signal.

According to another embodiment of the present invention, a driving circuit of a loudspeaker is provided. The driving circuit may include a periodic signal generation circuit, a signal processing circuit, a class-D amplifier circuit, a current sensing circuit, a logic control circuit, and a sample and hold circuit. The periodic signal generation circuit may be arranged to generate a periodic signal. The signal processing circuit may be coupled to the periodic signal generation circuit, and may be arranged to receive a first audio input signal, a second audio input signal, and the periodic signal, and generate a pre-driving signal according to the first audio input signal, the second audio input signal, and the periodic signal, wherein the second audio input signal is an inverse of the first audio input signal. The class-D amplifier circuit may be coupled to the signal processing circuit, and may be arranged to drive the loudspeaker according to the pre-driving signal. The current sensing circuit may be coupled to the class-D amplifier circuit, and may be arranged to sense a driving current of the loudspeaker to generate a current sensing signal. The logic control circuit may be coupled to the signal processing circuit, and may be arranged to generate a control signal according to the pre-driving signal. The sample and hold circuit may be coupled to the current sensing circuit and the logic control circuit, and may be arranged to sample and hold the current sensing signal according to the control signal, to generate a first current sampling signal.

According to another embodiment of the present invention, a method for generating a first current sampling signal of a loudspeaker is provided. The method may include: generating a periodic signal; generating a pre-driving signal according to a first audio input signal, a second audio input signal, and the periodic signal, wherein the second audio input signal is an inverse of the first audio input signal; driving the loudspeaker, by a class-D amplifier circuit, according to the pre-driving signal; sensing a driving current of the loudspeaker to generate a current sensing signal; generating a control signal according to the pre-driving signal; and sampling and holding the current sensing signal according to the control signal, to generate a second current sampling signal. In addition, the method may further include: performing computation upon the second current sampling signal, to generate the first current sampling signal.

One of the benefits of the present invention is that, by sampling and holding the current sensing signal at the time the triangle wave signal has the peak value according to the control signal, the second-order harmonic distortion may be improved and the problem of DC offset may be avoided, wherein the peak value of the triangle wave signal corresponds to a time interval where the current flows through the loudspeaker and all of the current sense resistors at the same time. In addition, the current sensing signal may also be sampled and held only during a period in which the current flows through the loudspeaker and all of the current sense resistors at the same time according to the control signal, to generate a first current sampling signal. Then, average value computation may be performed upon the first current sampling signal, to generate a second current sampling signal of the loudspeaker. In this way, the second-order harmonic distortion may also be improved and the problem of DC offset may also be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
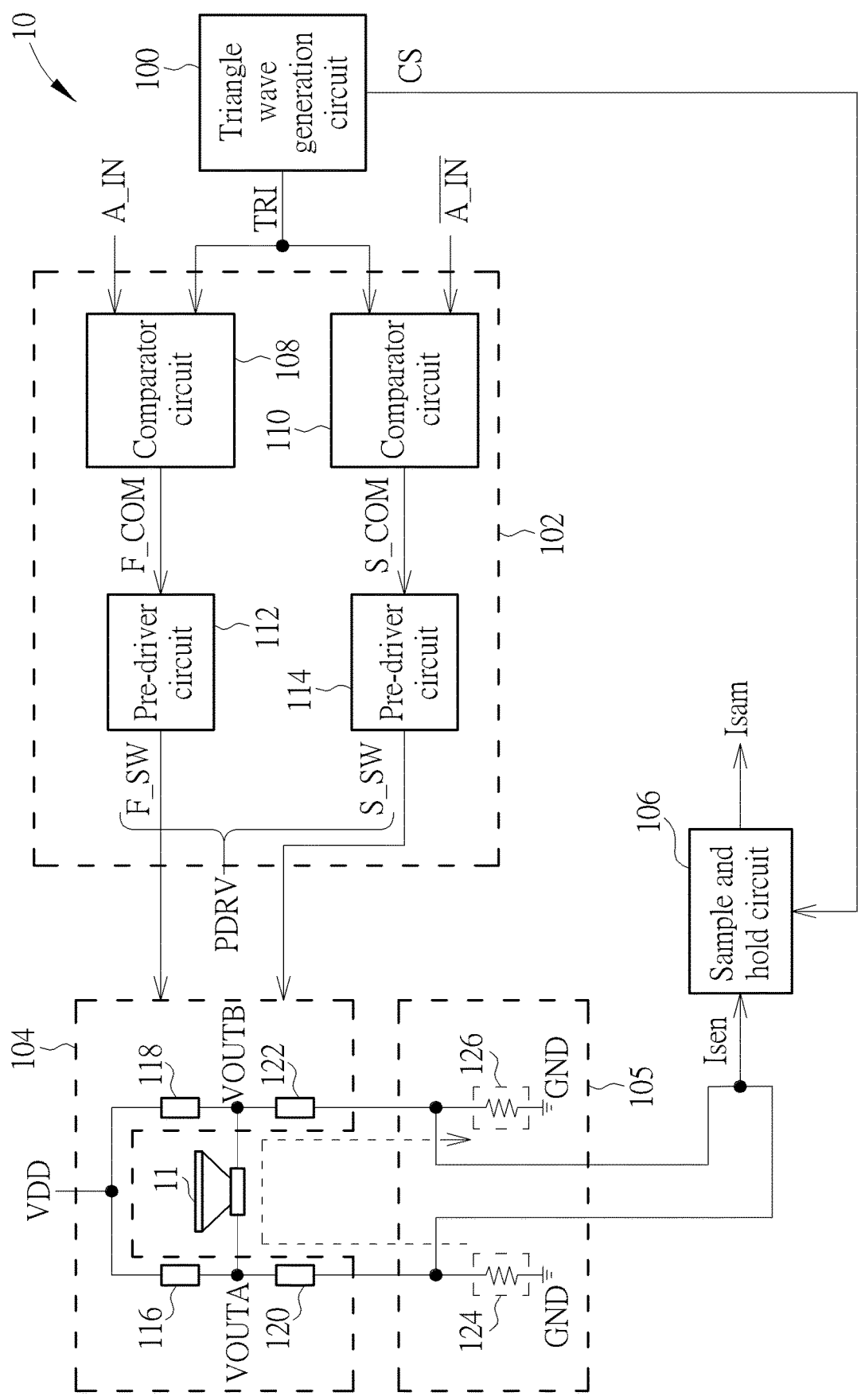
FIG. 1 is a diagram illustrating a driving circuit of a loudspeaker according to an embodiment of the present invention.

FIG. 1 is a diagram illustrating a driving circuit 10 of a loudspeaker 11 according to an embodiment of the present invention. The driving circuit 10 may include a periodic signal generation circuit (e.g. a triangle wave generation circuit 100), a signal processing circuit 102, a class-D amplifier circuit 104, a current sensing circuit 105, and a sample and hold circuit 106. It should be noted that, the triangle wave generation circuit 100 is only for illustrative purposes, and the present invention is not limited thereto. In practice, any other type of the periodic signal (e.g. a sawtooth wave signal) will fall within the scope of the present invention. The triangle wave generation circuit 100 may be arranged to generate a triangle wave signal TRI and a control signal CS, wherein the control signal CS may be arranged to indicate occurrence timing of a specific extreme value (e.g. a peak value) of the triangle wave signal TRI.

The signal processing circuit 102 may be coupled to the triangle wave generation circuit 100, and may be arranged to receive two audio input signals A_IN and $\overline{\text{A\_IN}}$ and the triangle wave signal TRI, and generate a pre-driving signal PDRV according to the audio input signals A_IN and $\overline{\text{A\_IN}}$ and the triangle wave signal TRI, wherein the pre-driving signal PDRV includes a first switch pre-driving signal F_SW and a second switch pre-driving signal S_SW, and the audio input signal $\overline{\text{A\_IN}}$ is an inverse of the audio input signal A_IN (i.e. the phase difference between the audio input signal A_IN and the audio input signal $\overline{\text{A\_IN}}$ is 180 degrees). The signal processing circuit 102 may include two comparator circuits 108 and 110 and two pre-driver circuits 112 and 114. The comparator circuit 108 may be coupled to the triangle wave generation circuit 100, and may be arranged to compare the audio input signal A_IN with the triangle wave signal TRI, to generate a first comparator result signal F_COM. The comparator circuit 110 may be coupled to the triangle wave generation circuit 100, and may be arranged to compare the audio input signal $\overline{\text{A\_IN}}$ with the triangle wave signal TRI, to generate a second comparison result signal S_COM. The pre-driver circuit 112 may be coupled to the comparator circuit 108, and may be arranged to generate the first switch pre-driving signal F_SW according to the first comparator result signal F_COM. The pre-driver circuit 114 may be coupled to the comparator circuit 110, and may be arranged to generate the second switch pre-driving signal S_SW according to the second comparison result signal S_COM.

The loudspeaker 11 acts as a load of the class-D amplifier circuit 104. The class-D amplifier circuit 104 may be coupled to the signal processing circuit 102, and may be arranged to drive the loudspeaker 11 according to the pre-driving signal PDRV (i.e. the first switch pre-driving signal F_SW and the second switch pre-driving signal S_SW). The class-D amplifier circuit 104 may include four switch circuits 116, 118, 120, and 122. The switch circuit 116 has a first end coupled to a first reference voltage (e.g. a power voltage VDD). The switch circuit 118 has a first end coupled to the first reference voltage (e.g. the power voltage VDD), wherein the loudspeaker 11 is coupled between a second end of the switch circuit 116 and a second end of the switch circuit 118. The switch circuit 120 has a first end coupled to the second end of the switch circuit 116, and the switch circuit 122 has a first end coupled to the second end of the switch circuit 118. In addition, the first switch pre-driving signal F_SW may be arranged to conduct one of the switch circuit 116 and the switch circuit 120, and the second switch pre-driving signal S_SW may be arranged to conduct one of the switch circuit 118 and the switch circuit 122.

It should be noted that, the modulation method of the class-D amplifier circuit 104 is BD modulation. That is, there are 4 directions of current flowing through the loudspeaker 11 in the class-D amplifier circuit 104. According to the first switch pre-driving signal F_SW and the second switch pre-driving signal S_SW, 4 switch timings a, b, c, d of the 4 switch circuits 116, 118, 120, and 122 may be obtained. It is assumed that a voltage at a node between the switch circuit 116 and the switch circuit 120 is VOUTA, and a voltage at a node between the switch circuit 118 and the switch circuit 122 is VOUTB.

For the positive half cycle of the audio input signal A_IN, in the switch timing a, the first switch pre-driving signal F_SW may be arranged to conduct the switch circuit 116, and the second switch pre-driving signal S_SW may be arranged to conduct the switch circuit 122 (i.e. the level of the voltage VOUTA is high, and the level of the voltage VOUTB is low). In the switch timing b, the first switch pre-driving signal F_SW may be arranged to conduct the switch circuit 116, and the second switch pre-driving signal S_SW may be arranged to conduct the switch circuit 118 (i.e. both of the levels of the voltages VOUTA and VOUTB are high). In the switch timing c, the first switch pre-driving signal F_SW may be arranged to conduct the switch circuit 116, and the second switch pre-driving signal S_SW may be arranged to conduct the switch circuit 122 (i.e. the level of the voltage VOUTA is high, and the level of the voltage VOUTB is low). In the switch timing d, the first switch pre-driving signal F_SW may be arranged to conduct the switch circuit 120, and the second switch pre-driving signal S_SW may be arranged to conduct the switch circuit 122 (i.e. both of the levels of the voltages VOUTA and VOUTB are low).

For the negative half cycle of the audio input signal A_IN, in the switch timing a, the first switch pre-driving signal F_SW may be arranged to conduct the switch circuit 120, and the second switch pre-driving signal S_SW may be arranged to conduct the switch circuit 118 (i.e. the level of the voltage VOUTA is low, and the level of the voltage VOUTB is high). In the switch timing b, the first switch pre-driving signal F_SW may be arranged to conduct the switch circuit 116, and the second switch pre-driving signal S_SW may be arranged to conduct the switch circuit 118 (i.e. both of the levels of the voltages VOUTA and VOUTB are high). In the switch timing c, the first switch pre-driving signal F_SW may be arranged to conduct the switch circuit 120, and the second switch pre-driving signal S_SW may be arranged to conduct the switch circuit 118 (i.e. the level of the voltage VOUTA is low, and the level of the voltage VOUTB is high). In the switch timing d, the first switch pre-driving signal F_SW may be arranged to conduct the switch circuit 120, and the second switch pre-driving signal S_SW may be arranged to conduct the switch circuit 122 (i.e. both of the levels of the voltages VOUTA and VOUTB are low).

The current sensing circuit 105 may be coupled to the class-D amplifier circuit 104, and may be arranged to sense a driving current of the loudspeaker 11 to generate a current sensing signal Isen. The current sensing circuit 105 may include two current sensing resistors 124 and 126, wherein the current sensing resistor 124 may be coupled between a second end of the switch circuit 120 and a second reference voltage (e.g. a ground voltage GND), and the current sensing resistor 126 may be coupled between a second end of the switch circuit 122 and the second reference voltage (e.g. the ground voltage GND).

In light of the above, in the switch timing a, for the positive half cycle of the audio input signal A_IN, the current will flow through the switch circuit 116, the loudspeaker 11, the switch circuit 122, and the current sensing resistor 126 in sequence. As a result, the current sensing signal Isen is generated according to the current sensing resistor 126. For the negative half cycle of the audio input signal A_IN, the current will flow through the switch circuit 118, the loudspeaker 11, the switch circuit 120, and the current sensing resistor 124 in sequence. As a result, the current sensing signal Isen is generated according to the current sensing resistor 124. However, if the current sensing resistors 124 and 126 are not matching (e.g. resistance values of the current sensing resistors 124 and 126 are different), the current sensing signal Isen generated by current sensing circuit 105 will not be the same. In the switch timing b, for the positive half cycle or the negative half cycle of the audio input signal A_IN, the current will flow through the switch circuit 116, the loudspeaker 11, and the switch circuit 118 in sequence (i.e. will not flow through either the current sensing resistor 124 or the current sensing resistor 126). As a result, the current sensing signal Isen is equal to 0 in the switch timing b. The current direction in the switch timing c is the same as that in the switch circuit a. For brevity, similar descriptions are not repeated in detail here.

On the other hand, in the switch timing d, for the positive half cycle or the negative half cycle of the audio input signal A_IN, the current will flow through the current sensing resistor 124, the switch circuit 120, the loudspeaker 11, the switch circuit 122, and the current sensing resistor 126 in sequence (the current direction is labeled as dashed line in FIG. 1), and the current sensing signal Isen is generated according to the current sensing resistors 124 and 126. No matter whether the resistance values of the current sensing resistors 124 and 126 are matching, the current sensing signal Isen generated by current sensing circuit 105 will be the same. In addition, please note that at the occurrence timing of the peak value of the triangle wave signal TRI, the 4 switch circuits 116, 118, 120, and 122 has the switch timing d. As a result, the sample and hold circuit 106 may be coupled to the triangle wave generation circuit 100 and the current sensing circuit 105, and may be arranged to sample and hold the current sensing signal Isen at the time the triangle wave signal TRI has the peak value according to the control signal CS, to generate a current sampling signal Isam of the loudspeaker 11. In this way, the second-order harmonic distortion and the DC offset that are caused by mismatch of the current sensing resistors 124 and 126 may be improved.

Figure 2:
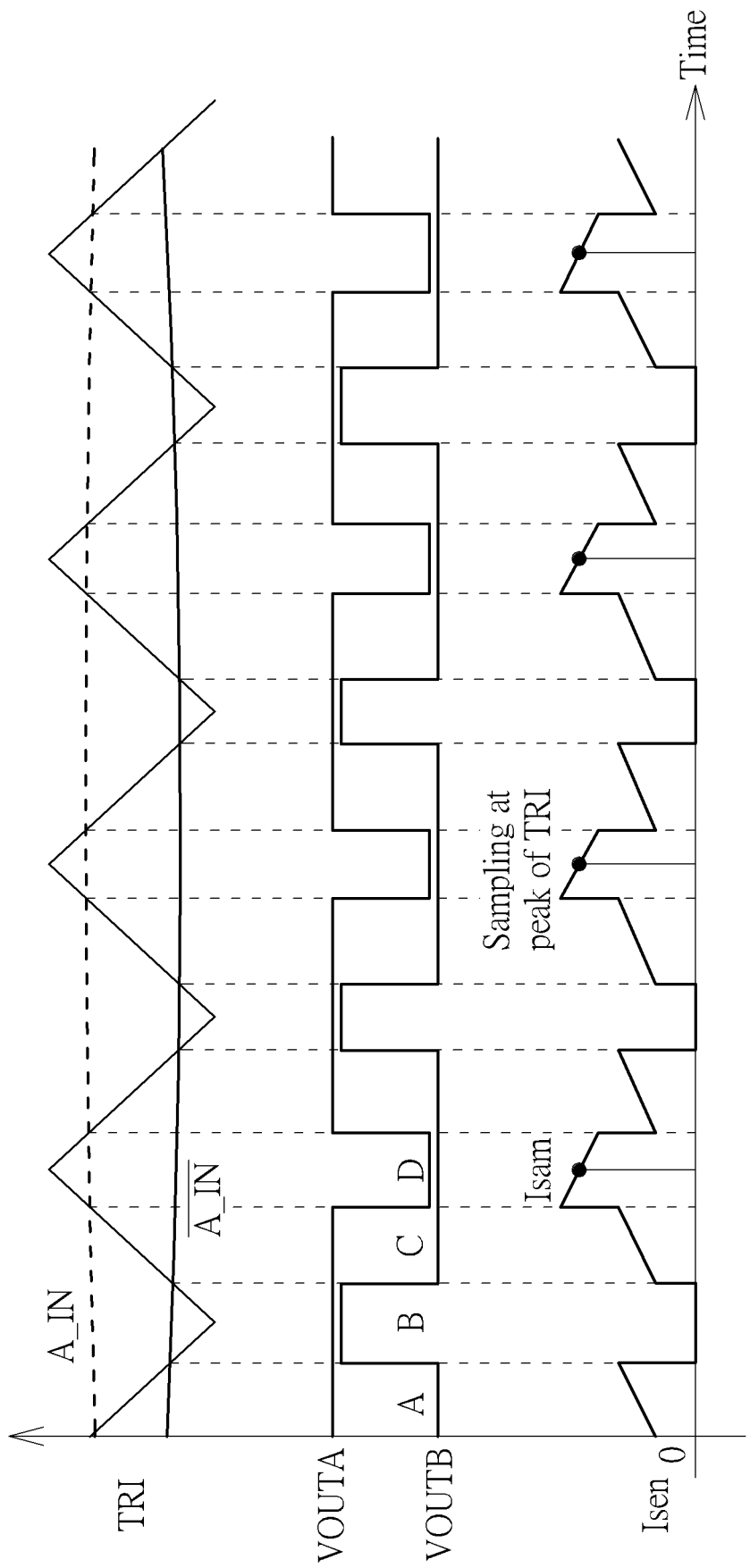
FIG. 2 is a diagram illustrating associated signals of the driving circuit shown in FIG. 1 according to an embodiment of the present invention.

FIG. 2 is a diagram illustrating associated signals of the driving circuit shown in FIG. 1 according to an embodiment of the present invention. In this embodiment, the triangle wave signal TRI may be compared with the positive half cycle of the audio input signal A_IN and the corresponding audio input signal $\overline{A\_IN}$, to generate the 4 switch timings a, b, c, and d, wherein the 4 switch timings a, b, c, and d correspond to 4 time intervals A, B, C, and D, respectively. In addition, as shown in FIG. 2, the peak value of the triangle wave signal TRI corresponds to the time interval D (both of the levels of the voltages VOUA and VOUTB are low in the time interval D), and the current sensing signal Isen may be sampled and held at the time the triangle wave signal TRI has the peak value according to the control signal CS, to generate the current sampling signal Isam. For brevity, similar descriptions for this embodiment are not repeated in detail here.

Figure 3:
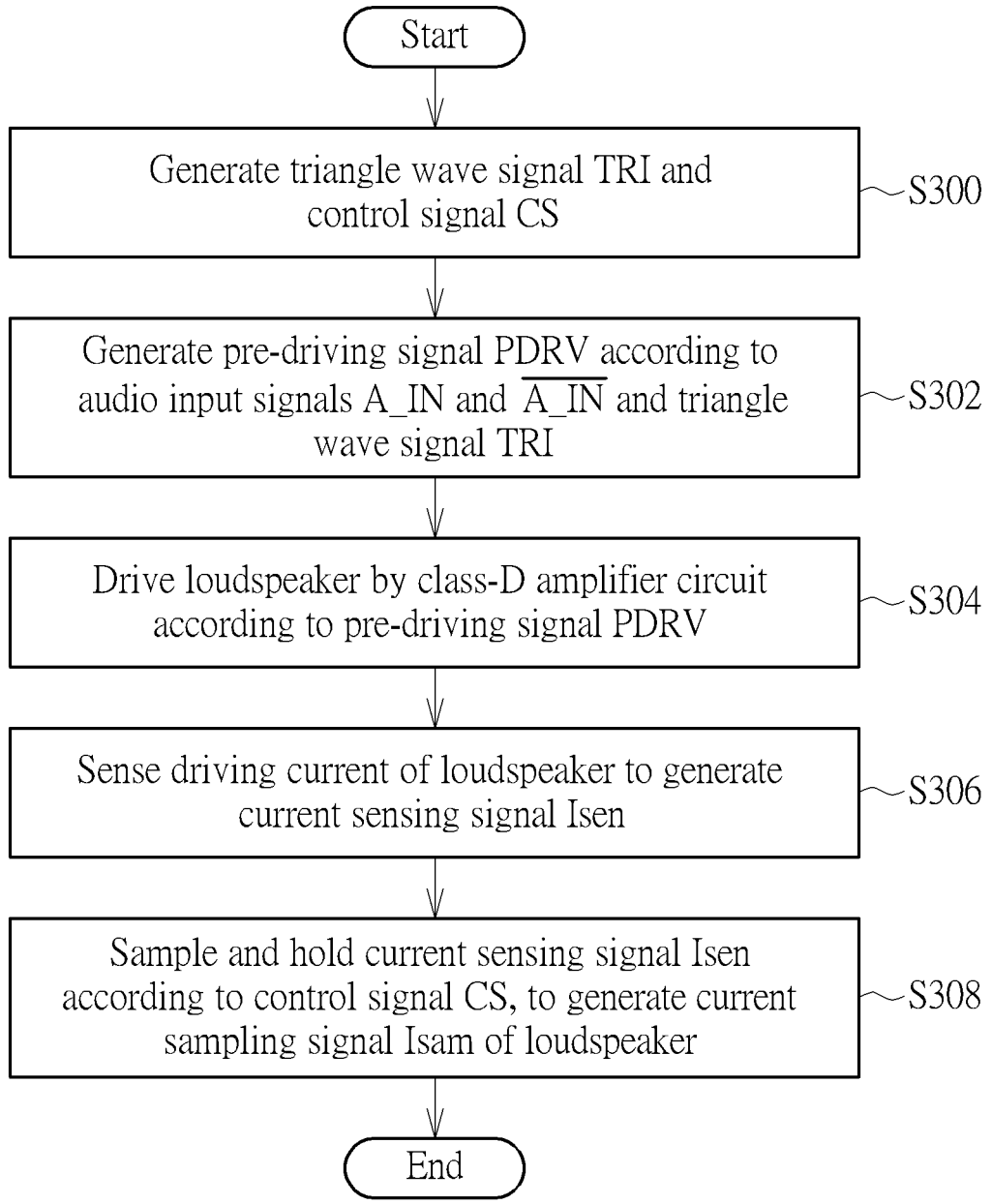
FIG. 3 is a flow chart illustrating a method for generating a current sampling signal of a loudspeaker according to an embodiment of the present invention.

FIG. 3 is a flow chart illustrating a method for generating a current sampling signal of a loudspeaker according to an embodiment of the present invention. Provided that the result is substantially the same, the steps are not required to be executed in the exact order shown in FIG. 3. For example, the method shown in FIG. 3 may be employed by the driving circuit 10 shown in FIG. 1.

In Step S300, the triangle wave signal TRI and the control signal CS are generated, wherein the control signal CS is arranged to indicate occurrence timing of the peak value of the triangle wave signal TRI.

In Step S302, the pre-driving signal PDRV is generated according to the audio input signals A_IN and $\overline{A\_IN}$ and the triangle wave signal TRI, wherein the audio input signal $\overline{\text{A\_IN}}$ is an inverse of the audio input signal A_IN.

In Step S304, the loudspeaker 11 is driven by the class-D amplifier circuit 104, according to the pre-driving signal PDRV.

In Step S306, the driving current of the loudspeaker 11 is sensed to generate the current sensing signal Isen.

In Step S308, the current sensing signal Isen is sampled and held according to the control signal CS, to generate the current sampling signal Isam of the loudspeaker 11.

Since a person skilled in the pertinent art can readily understand details of the steps after reading above paragraphs directed to the driving circuit 10 shown in FIG. 1, further description is omitted here for brevity.

Figure 4:
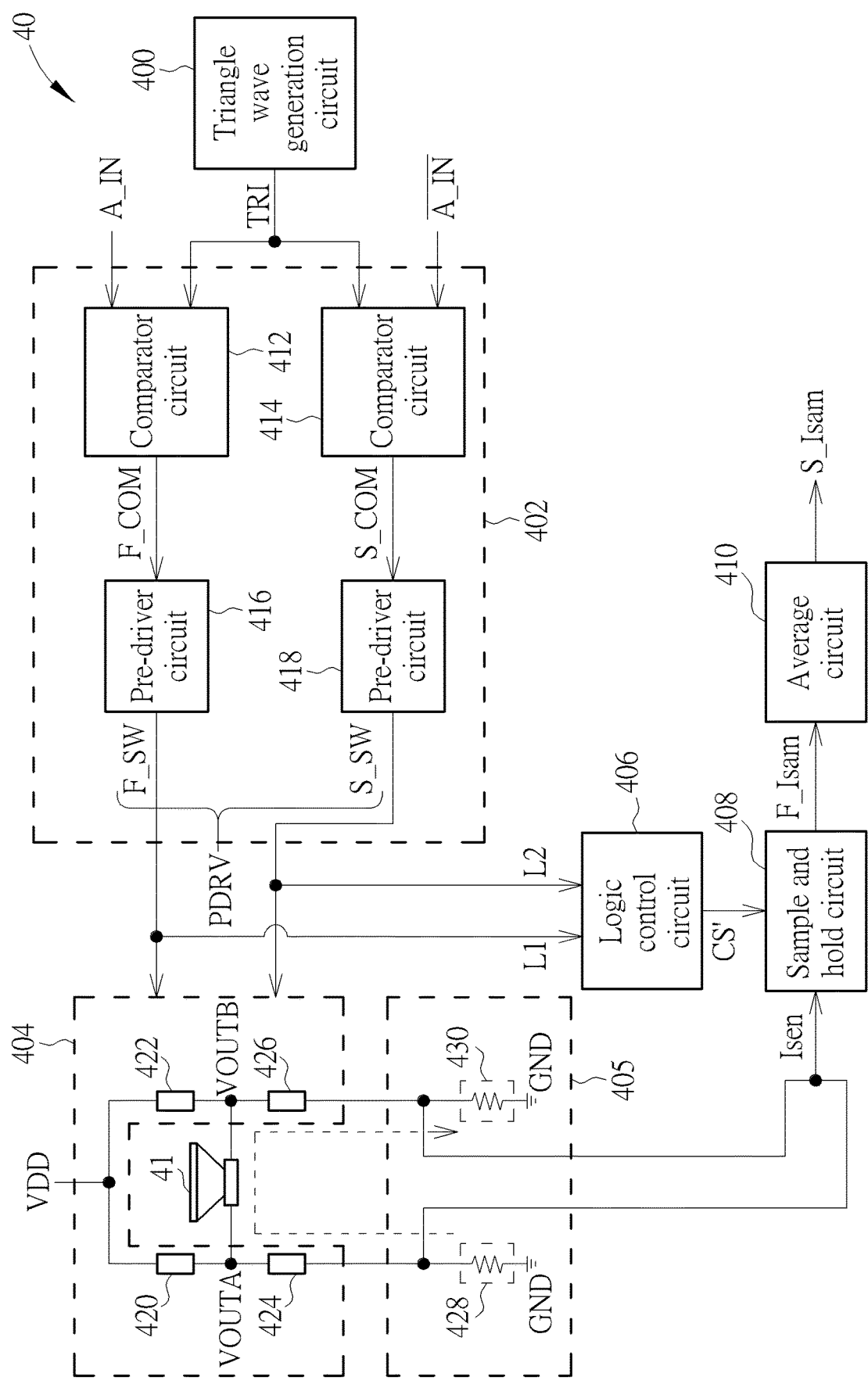
FIG. 4 is a diagram illustrating a driving circuit of a loudspeaker according to another embodiment of the present invention.

FIG. 4 is a diagram illustrating a driving circuit 40 of a loudspeaker 41 according to another embodiment of the present invention. The driving circuit 40 may include a periodic signal generation circuit (e.g. a triangle wave generation circuit 400), a signal processing circuit 402, a class-D amplifier circuit 404, a logic control circuit 406, a sample and hold circuit 408, and a computation circuit (e.g. an average circuit 410). It should be noted that, the triangle wave generation circuit 400 and the average circuit 410 are only for illustrative purposes, and the present invention is not limited thereto. In practice, any other type of the periodic signal (e.g. a sawtooth wave signal) and any other type of the computation circuit will fall within the scope of the present invention.

The difference between the driving circuit 10 shown in FIG. 1 and the driving circuit 40 shown in FIG. 4 is that the driving circuit 40 further includes the logic control circuit 406 and the average circuit 410, and the triangle wave generation circuit 402 is arranged to generate the triangle wave signal TRI without an accompanying signal that indicates occurrence timing of a specific extreme value of a periodic signal (e.g. a peak value of the triangle wave signal TRI). The logic control circuit 406 may be coupled to the signal processing circuit 402, and may be arranged to generate a control signal CS' according to the pre-driving signal PDRV (i.e. the first switch pre-driving signal F_SW and the second switch pre-driving signal S_SW). The sample and hold circuit 408 may be coupled to the current sensing circuit 405 and the logic control circuit 406, and may be arranged to sample and hold the current sensing signal Isen according to the control signal CS', to generate a first current sampling signal F_Isam. In this embodiment, the first current sampling signal F_Isam is a collection of consecutive sample values of the current sensing signal Isen. The average circuit 410 may be coupled to the sample and hold circuit 408, and may be arranged to perform average value computation upon the first current sampling signal F_Isam, to generate a second current sampling signal S Isam of the loudspeaker 41. For brevity, similar descriptions for this embodiment are not repeated in detail here.

It should be noted that, the logic control circuit 406 may be arranged to generate the control signal CS' according to a first logic value L1 and a second logic value L2, wherein the first logic value L1 may be generated according to the first switch pre-driving signal F_SW, and the second logic value L2 may be generated according to the second switch pre-driving signal S_SW. For example, the logic control circuit 406 may be a NOR gate circuit, wherein the NOR gate circuit has a first input terminal coupled to the pre-driver circuit 416, a second input terminal coupled to the pre-driver circuit 418, and an output terminal coupled to the sample and hold circuit 408, and may be arranged to receive the first logic value L1 and the second logic value L2, to generate the control signal CS', but the present invention is not limited thereto.

When the switch circuit 420 is turned on according to the first switch pre-driving signal F_SW (i.e. the level of the voltage VOUTA is high), the first logic value L1 is equal to 1. When the switch circuit 424 is turned on according to the first switch pre-driving signal F_SW (i.e. the level of the voltage VOUTA is low), the first logic value L1 is equal to 0. On the other hand, when the switch circuit 422 is turned on according to the second switch pre-driving signal S_SW (i.e. the level of the voltage VOUTB is high), the second logic value L2 is equal to 1. When the switch circuit 426 is turned on according to the second switch pre-driving signal S_SW (i.e. the level of the voltage VOUTB is low), the second logic value L2 is equal to 0. The control signal CS' may be arranged to control the sample and hold circuit 408 to sample and hold the current sensing signal Isen only during a period in which the switch circuit 424 and the switch circuit 426 are turned on by the first switch pre-driving signal F_SW and the second switch pre-driving signal S_SW, respectively (i.e. both of the levels of the voltages VOUTA and VOUTB are low, and both of the first logic value L1 and the second logic value L2 are 0). That is, only when the control signal CS' is equal to 1 (i.e. a result of NORing the first logic value L1 (L1=0) and the second logic value L2 (L2=0) is equal to 1), the current sensing signal Isen is sampled and held by the sample and hold circuit 408, to generate the first current sampling signal F_Isam.

Figure 5:
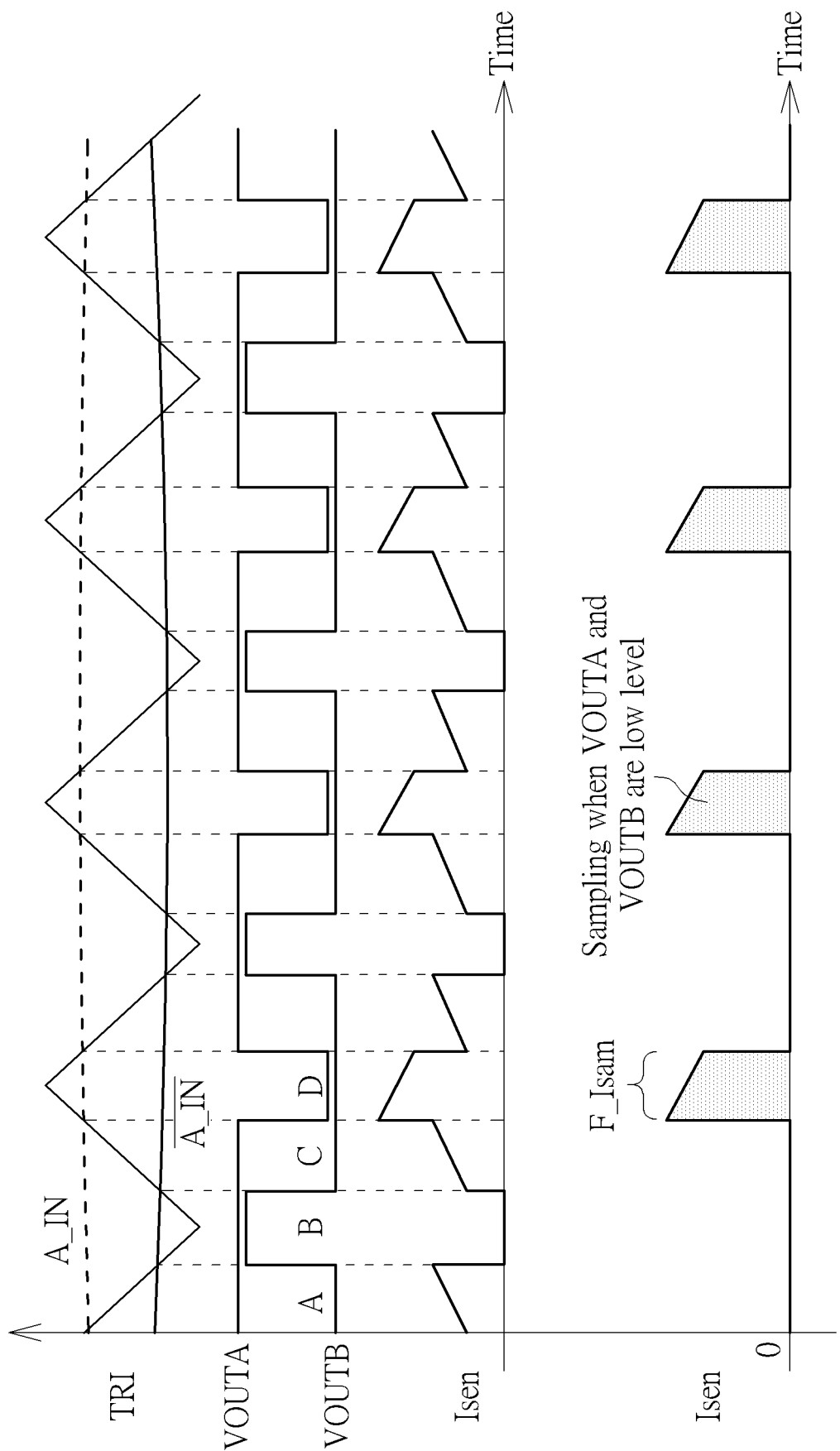
FIG. 5 is a diagram illustrating associated signals of the driving circuit shown in FIG. 4 according to an embodiment of the present invention.

FIG. 5 is a diagram illustrating associated signals of the driving circuit 40 shown in FIG. 4 according to an embodiment of the present invention. The triangle wave signal TRI may be compared with the positive half cycle of the audio input signal A_IN and the corresponding audio input signal $\overline{\text{A\_IN}}$, and the logic combinations of the first logic value L1 and the second logic value L2 (i.e. 10, 11, 10, 00) correspond to 4 time intervals A, B, C, and D, respectively. In the time interval A, the level of the voltage VOUTA is high and the level of the voltage VOUTB is low (i.e. the combination of the first logic value L1 and the second logic value L2 is 10). In the time interval B, both of the levels of the voltages VOUTA and VOUTB are high (i.e. the combination of the first logic value L1 and the second logic value L2 is 11). In the time interval C, the level of the voltage VOUTA is high and the level of the voltage VOUTB is low (i.e. the combination of the first logic value L1 and the second logic value L2 is 10). In the time interval D, both of the levels of the voltages VOUTA and VOUTB are low (i.e. the combination of the first logic value L1 and the second logic value L2 is 00). In addition, as shown in FIG. 5, the current sensing signal Isen are sampled and held only during the time interval D according to the control signal CS'. For brevity, similar descriptions for this embodiment are not repeated in detail here.

Figure 6:
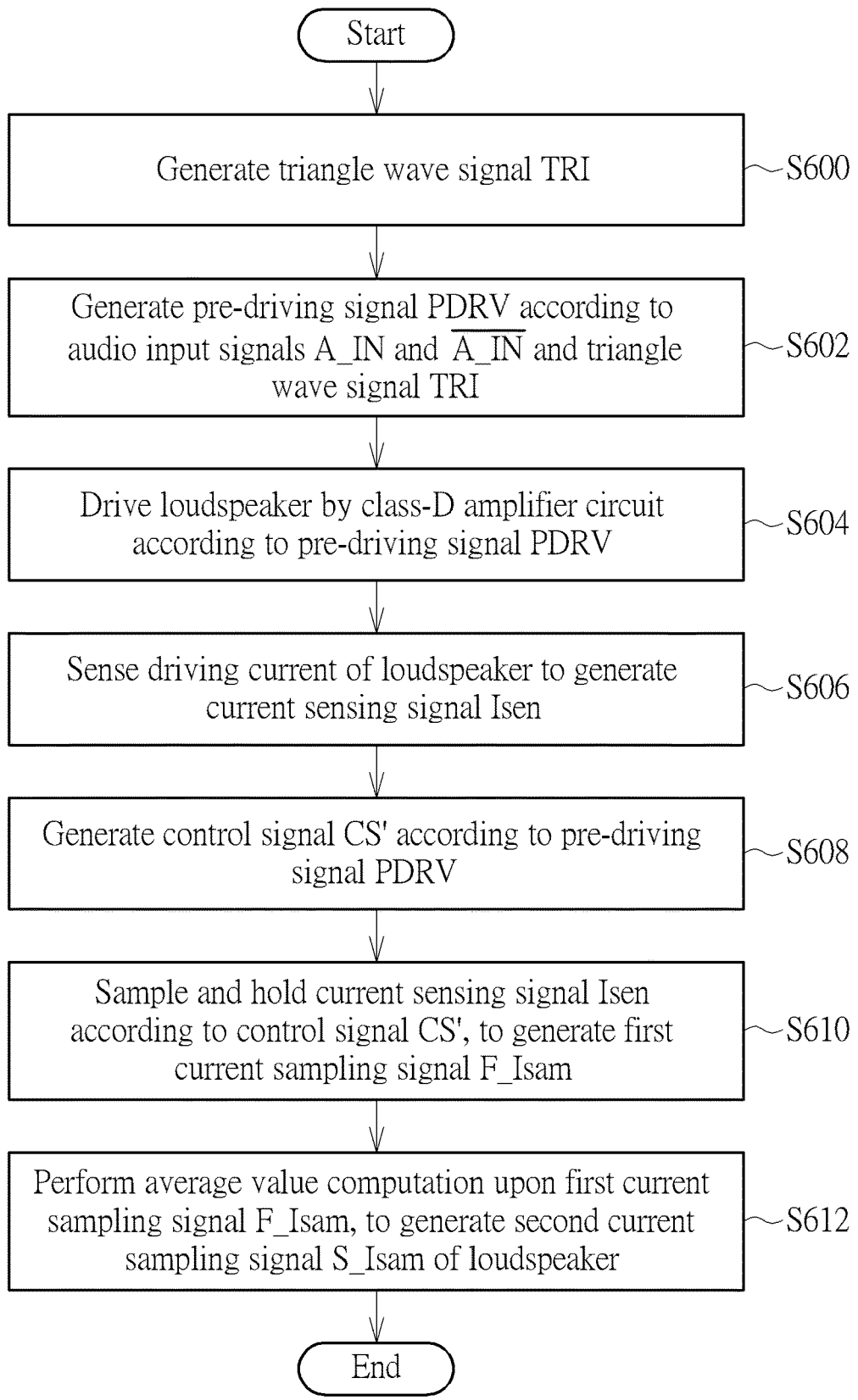
FIG. 6 is a flow chart illustrating a method for generating a current sampling signal of a loudspeaker according to another embodiment of the present invention.

FIG. 6 is a flow chart illustrating a method for generating a current sampling signal of a loudspeaker according to another embodiment of the present invention. Provided that the result is substantially the same, the steps are not required to be executed in the exact order shown in FIG. 6. For example, the method shown in FIG. 6 may be employed by the driving circuit 40 shown in FIG. 4.

In Step S600, the triangle wave signal TRI is generated.

In Step S602, the pre-driving signal PDRV is generated according to the audio input signals A_IN and $\overline{\text{A\_IN}}$ and the triangle wave signal TRI, wherein the audio input signal $\overline{\text{A\_IN}}$ is an inverse of the audio input signal A_IN.

In Step S604, the loudspeaker 41 is driven by the class-D amplifier circuit 404, according to the pre-driving signal PDRV.

In Step S606, the driving current of the loudspeaker 41 is sensed to generate the current sensing signal Isen.

In Step S608, the control signal CS' is generated according to the pre-driving signal PDRV.

In Step S610, the current sensing signal Isen is sampled and held according to the control signal CS', to generate the first current sampling signal F_Isam.

In Step S612, the second current sampling signal S Isam of the loudspeaker 41 is generated by performing average value computation upon the first current sampling signal F_Isam.

Since a person skilled in the pertinent art can readily understand details of the steps after reading above paragraphs directed to the driving circuit 40 shown in FIG. 4, further description is omitted here for brevity.

Figure 7:
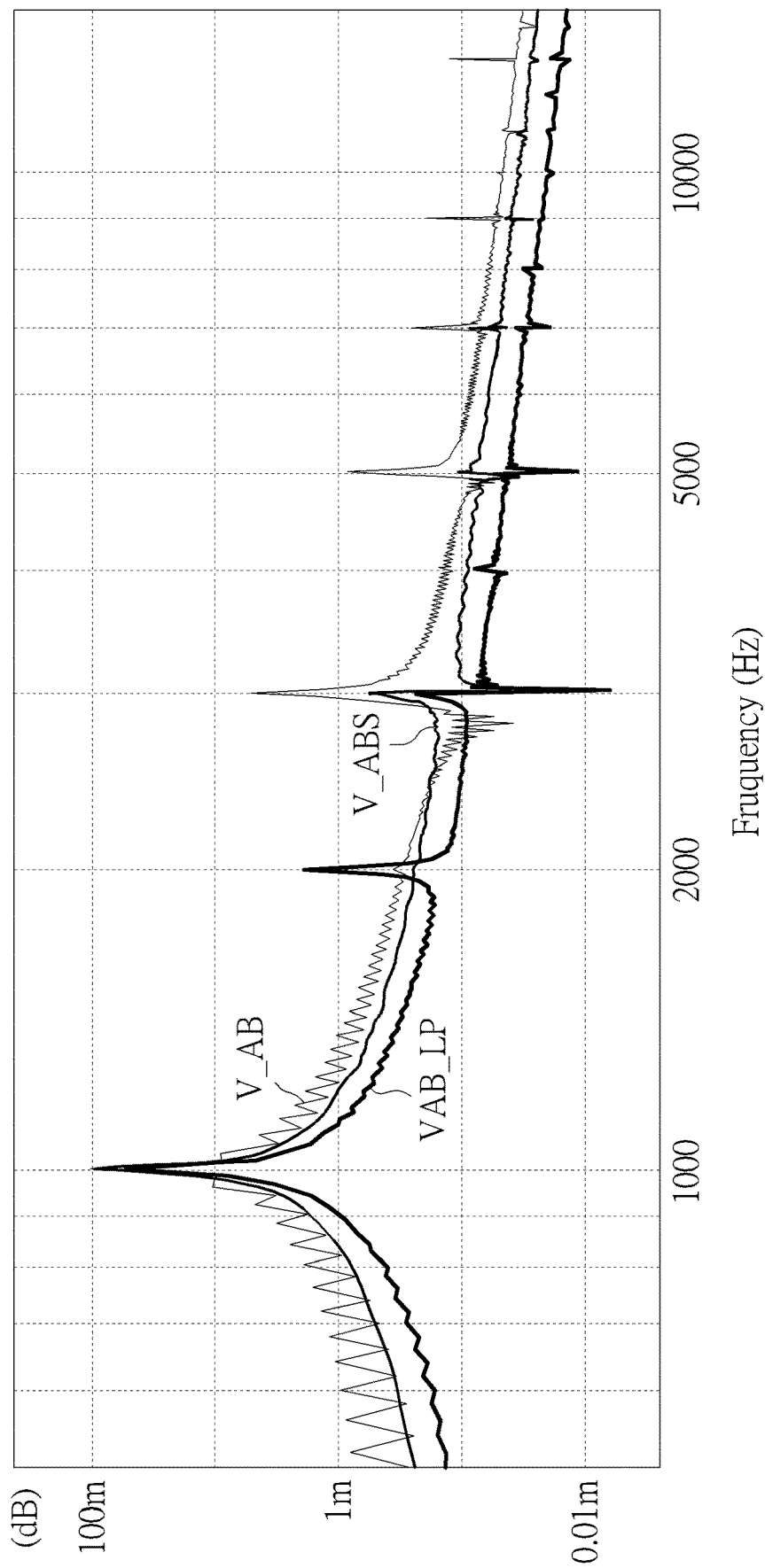
FIG. 7 is a diagram illustrating frequency-domain analysis for a sensing voltage signal, a sampling voltage signal generated by the driving circuit shown in FIG. 1, and a voltage signal generated by a low pass filter.

FIG. 7 is a diagram illustrating frequency-domain analysis for a sensing voltage signal V_AB, a sampling voltage signal V_ABS generated by the driving circuit 10 shown in FIG. 1, and a voltage signal VAB_LP generated by a low pass filter. It is assumed that a voltage at a node between the switch circuit 120 and the current sensing resistor 124 is a sensing voltage VSENSEA, and a voltage at a node between the switch circuit 122 and the current sensing resistor 126 is a sensing voltage VSENSEB. The sensing voltage signal V_AB is a voltage difference between the sensing voltage VSENSEA and the sensing voltage VSENSEB. In addition, the sensing voltage signal V_AB is generated under a condition that the current sensing resistor 124 and the current sensing resistor 126 are matching (i.e. resistance values of the current sensing resistors 124 and 126 are the same).

The sampling voltage signal V_ABS may be generated by the driving circuit 10 shown in FIG. 1, and may correspond to the current sampling signal Isam. The current sensing circuit 105 shown in FIG. 1 may be modified to be coupled to a low pass filter, instead of the sampling and hold circuit 106, such that the voltage signal VAB_LP may be generated by directly low pass filtering the current sensing signal Isen. It should be noted that the sampling voltage signal V_ABS and the voltage signal VAB_LP are generated under a condition that the current sensing resistor 124 and the current sensing resistor 126 are not matching (i.e. resistance values of the current sensing resistors 124 and 126 are different; for example, the resistance value of the current sensing resistor 124 is 0.1 ohm, and the resistance value of the current sensing resistor 126 is 0.2 ohm). As shown in FIG. 7, since the current sensing resistor 124 and the current sensing resistor 126 are matching, the sensing voltage signal V_AB has a better second-order harmonic distortion at 2000 Hz. On the other hand, due to the resistor mismatch, the voltage signal VAB_LP has a poor harmonic distortion at 2000 Hz. However, despite the resistor mismatch, the sampling voltage signal V_ABS still has a better second-order harmonic distortion at 2000 Hz. As a result, the driving circuit 10 provided by the present invention may improve the second-order harmonic distortion.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit of a loudspeaker, comprising:
a periodic signal generation circuit, arranged to generate a periodic signal and a control signal, wherein the control signal is arranged to indicate occurrence timing of a specific extreme value of the periodic signal;
a signal processing circuit, coupled to the periodic signal generation circuit, and arranged to receive a first audio input signal, a second audio input signal, and the periodic signal, and generate a pre-driving signal according to the first audio input signal, the second audio input signal, and the periodic signal, wherein the second audio input signal is an inverse of the first audio input signal;
a class-D amplifier circuit, coupled to the signal processing circuit, and arranged to drive the loudspeaker according to the pre-driving signal;
a current sensing circuit, coupled to the class-D amplifier circuit, and arranged to sense a driving current of the loudspeaker to generate a current sensing signal, wherein the current sensing circuit comprises multiple resistors; and
a sample and hold circuit, coupled to the periodic signal generation circuit and the current sensing circuit, wherein according to the control signal, the sample and hold circuit samples and holds the current sensing signal only when the periodic signal has the specific extreme value, to generate a current sampling signal of the loudspeaker;
wherein at the occurrence timing of the specific extreme value of the periodic signal, a current simultaneously flows through the loudspeaker and the multiple resistors.

2. The driving circuit of claim 1, wherein the periodic signal generation circuit is a triangle wave generation circuit, the periodic signal is a triangle wave signal, and the specific extreme value is a peak value of the triangle wave signal.

3. The driving circuit of claim 2, wherein the sample and hold circuit is arranged to sample and hold the current sensing signal at the time the triangle wave signal has the peak value.

4. The driving circuit of claim 1, wherein the pre-driving signal comprises a first switch pre-driving signal and a second switch pre-driving signal;
the class-D amplifier circuit comprises:
a first switch circuit, having a first end coupled to a first reference voltage;
a second switch circuit, having a first end coupled to the first reference voltage, wherein the loudspeaker is coupled between a second end of the first switch circuit and a second end of the second switch circuit;
a third switch circuit, having a first end coupled to the second end of the first switch circuit; and
a fourth switch circuit, having a first end coupled to the second end of the second switch circuit;
and the multiple resistors comprised in the current sensing circuit comprise:
a first resistor, coupled between a second end of the third switch circuit and a second reference voltage; and
a second resistor, coupled between a second end of the fourth switch circuit and the second reference voltage;
wherein the first switch pre-driving signal is arranged to conduct one of the first switch circuit and the third switch circuit; and the second switch pre-driving signal is arranged to conduct one of the second switch circuit and the fourth switch circuit.

5. The driving circuit of claim 4, wherein at the time the periodic signal has the specific extreme value, the third switch circuit and the fourth switch circuit are turned on by the first switch pre-driving signal and the second switch pre-driving signal, respectively.

6. A method for generating a current sampling signal of a loudspeaker, comprising:
generating a periodic signal and a control signal, wherein the control signal is arranged to indicate occurrence timing of a specific extreme value of the periodic signal;
generating a pre-driving signal according to a first audio input signal, a second audio input signal, and the periodic signal, wherein the second audio input signal is an inverse of the first audio input signal;
driving the loudspeaker, by a class-D amplifier circuit, according to the pre-driving signal;
sensing a driving current of the loudspeaker, by a current sensing circuit, to generate a current sensing signal; and
according to the control signal, sampling and holding the current sensing signal only when the periodic signal has the specific extreme value, to generate the current sampling signal;
wherein at the occurrence timing of the specific extreme value of the periodic signal, a current simultaneously flows through the loudspeaker and multiple resistors comprised in the current sensing circuit.

7. The method of claim 6, wherein the periodic signal is a triangle wave signal, and the specific extreme value is a peak value of the triangle wave signal.

8. The method of claim 7, wherein sampling and holding the current sensing signal according to the control signal comprises:
sampling and holding the current sensing signal at the time the triangle wave signal has the peak value.

9. The method of claim 6, wherein the pre-driving signal comprises a first switch pre-driving signal and a second switch pre-driving signal; the class-D amplifier circuit comprises a first switch circuit having a first end coupled to a first reference voltage, a second switch circuit having a first end coupled to the first reference voltage, a third switch circuit having a first end coupled to a second end of the first switch circuit, and a fourth switch circuit having a first end coupled to a second end of the second switch circuit; the loudspeaker is coupled between the second end of the first switch circuit and the second end of the second switch circuit; the multiple resistors comprised in the current sensing circuit comprise a first resistor coupled between a second end of the third switch circuit and a second reference voltage, and a second resistor coupled between a second end of the fourth switch circuit and the second reference voltage; and driving the loudspeaker according to the pre-driving signal comprises:
conducting one of the first switch circuit and the third switch circuit according to the first switch pre-driving signal; and
conducting one of the second switch circuit and the fourth switch circuit according to the second switch pre-driving signal.

10. The method of claim 9, wherein at the time the periodic signal has the specific extreme value, the third switch circuit and the fourth switch circuit are turned on by the first switch pre-driving signal and the second switch pre-driving signal, respectively.

11. A driving circuit of a loudspeaker, comprising:
a periodic signal generation circuit, arranged to generate a periodic signal;
a signal processing circuit, coupled to the periodic signal generation circuit, and arranged to receive a first audio input signal, a second audio input signal, and the periodic signal, and generate a pre-driving signal according to the first audio input signal, the second audio input signal, and the periodic signal, wherein the second audio input signal is an inverse of the first audio input signal;
a class-D amplifier circuit, coupled to the signal processing circuit, and arranged to drive the loudspeaker according to the pre-driving signal;
a current sensing circuit, coupled to the class-D amplifier circuit, and arranged to sense a driving current of the loudspeaker to generate a current sensing signal, wherein the current sensing circuit comprises multiple resistors;
a logic control circuit, coupled to the signal processing circuit, and arranged to generate a control signal according to the pre-driving signal; and
a sample and hold circuit, coupled to the current sensing circuit and the logic control circuit, wherein according to the control signal, the sample and hold circuit samples and holds the current sensing signal only when a current simultaneously flows through the loudspeaker and the multiple resistors, to generate a first current sampling signal.

12. The driving circuit of claim 11, further comprising:
a computation circuit, coupled to the sample and hold circuit, and arranged to perform computation upon the first current sampling signal, to generate a second current sampling signal of the loudspeaker.

13. The driving circuit of claim 12, wherein the computation circuit is an average circuit, and the computation is average value computation.

14. The driving circuit of claim 11, wherein the pre-driving signal comprises a first switch pre-driving signal and a second switch pre-driving signal; the class-D amplifier circuit comprises:
a first switch circuit, having a first end coupled to a first reference voltage;
a second switch circuit, having a first end coupled to the first reference voltage, wherein the loudspeaker is coupled between a second end of the first switch circuit and a second end of the second switch circuit;
a third switch circuit, having a first end coupled to the second end of the first switch circuit; and
a fourth switch circuit, having a first end coupled to the second end of the second switch circuit;
and the multiple resistors comprised in the current sensing circuit comprise:
a first resistor, coupled between a second end of the third switch circuit and a second reference voltage; and
a second resistor, coupled between a second end of the fourth switch circuit and the second reference voltage;
wherein the first switch pre-driving signal is arranged to conduct one of the first switch circuit and the third switch circuit; and the second switch pre-driving signal is arranged to conduct one of the second switch circuit and the fourth switch circuit.

15. The driving circuit of claim 14, wherein the control signal is arranged to control the sample and hold circuit to sample and hold the current sensing signal only during a period in which the third switch circuit and the fourth switch circuit are turned on by the first switch pre-driving signal and the second switch pre-driving signal, respectively.

16. A method for generating a first current sampling signal of a loudspeaker, comprising:
- generating a periodic signal;
- generating a pre-driving signal according to a first audio input signal, a second audio input signal, and the periodic signal, wherein the second audio input signal is an inverse of the first audio input signal;
- driving the loudspeaker, by a class-D amplifier circuit, according to the pre-driving signal;
- sensing a driving current of the loudspeaker, by a current sensing circuit, to generate a current sensing signal;
- generating a control signal according to the pre-driving signal; and
- according to the control signal, sampling and holding the current sensing signal only when a current simultaneously flows through the loudspeaker and multiple resistors comprised in the current sensing circuit, to generate a second current sampling signal.

17. The method of claim 16, further comprising:
- performing computation upon the second current sampling signal, to generate the first current sampling signal.

18. The method of claim 17, wherein the computation is average value computation.

19. The method of claim 16, wherein the pre-driving signal comprises a first switch pre-driving signal and a second switch pre-driving signal; the class-D amplifier circuit comprises a first switch circuit having a first end coupled to a first reference voltage, a second switch circuit having a first end coupled to the first reference voltage, a third switch circuit having a first end coupled to a second end of the first switch circuit, and a fourth switch circuit having a first end coupled to a second end of the second switch circuit; the loudspeaker is coupled between the second end of the first switch circuit and the second end of the second switch circuit; the multiple resistors comprised in the current sensing circuit comprise a first resistor coupled between a second end of the third switch circuit and a second reference voltage, and a second resistor coupled between a second end of the fourth switch circuit and the second reference voltage; and driving the loudspeaker according to the pre-driving signal comprises:
- conducting one of the first switch circuit and the third switch circuit according to the first switch pre-driving signal; and
- conducting one of the second switch circuit and the fourth switch circuit according to the second switch pre-driving signal.

20. The method of claim 19, wherein sampling and holding the current sensing signal according to the control signal comprises:
- sampling and holding the current sensing signal only during a period in which the third switch circuit and the fourth switch circuit are turned on by the first switch pre-driving signal and the second switch pre-driving signal, respectively.

* * * * *